US012592543B2

(12) United States Patent
Reboud et al.

(10) Patent No.: US 12,592,543 B2
(45) Date of Patent: Mar. 31, 2026

(54) LASER COMPRISING A DISTRIBUTED BRAGG MIRROR AND PRODUCTION METHOD

(71) Applicant: COMMISSARIAT A L'ENERGIE ATOMIQUE ET AUX ENERGIES ALTERNATIVES, Paris (FR)

(72) Inventors: Vincent Reboud, Grenoble (FR); Maryse Fournier, Grenoble (FR); Jean-Marc Fedeli, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 876 days.

(21) Appl. No.: 17/644,831

(22) Filed: Dec. 17, 2021

(65) Prior Publication Data

US 2022/0200238 A1    Jun. 23, 2022

(30) Foreign Application Priority Data

Dec. 18, 2020    (FR) ...................................... 20 13658

(51) Int. Cl.
*H01S 5/12*        (2021.01)
*H01S 5/042*        (2006.01)
(Continued)

(52) U.S. Cl.
CPC ........ *H01S 5/1237* (2013.01); *H01S 5/04254* (2019.08); *H01S 5/1231* (2013.01); (Continued)

(58) Field of Classification Search
CPC ............. H01S 5/1237; H01S 5/12–125; H01S 5/04254; H01S 5/04256
See application file for complete search history.

(56) References Cited

U.S. PATENT DOCUMENTS 6,501,783 B1 * 12/2002 Capasso ................ H01S 5/3402
                                                                    372/102
7,567,606 B2    7/2009 Carras et al.
(Continued)

OTHER PUBLICATIONS

French Preliminary Search Report issued Sep. 7, 2021 in French Application 20 13658 filed on Dec. 18, 2020, citing documents AA-AE & AQ-AU therein, 11 pages (with English Translation of Categories of Cited Documents & Written Opinion).
(Continued)

*Primary Examiner* — Sean P Hagan
(74) *Attorney, Agent, or Firm* — Oblon, McClelland, Maier & Neustadt, L.L.P.

(57)        ABSTRACT
A laser is provided, including: a distributed Bragg mirror; a waveguide, the laser to emit light radiation along a longitudinal direction x, and the waveguide formed at least in part in a stack of layers made of III-V materials including at least one active region to emit the light radiation, the mirror including lateral corrugations distributed periodically along the direction x in a period Λ, the corrugations being carried by at least a lateral plane xz defined by the direction x and a first transverse direction z normal to the direction x, the corrugations having a dimension d along a second transverse direction y normal to the direction x; and a top electrode arranged on the waveguide along the direction z, the corrugations being partly located at lateral flanks of the top electrode, extending parallel to the plane xz, and extending only on the lateral flanks of the top electrode.

11 Claims, 9 Drawing Sheets

(51) Int. Cl.
  *H01S 5/22*     (2006.01)
  *H01S 5/34*     (2006.01)
(52) U.S. Cl.
  CPC .............. *H01S 5/3402* (2013.01); *H01S 5/22*
      (2013.01); *H01S 2301/176* (2013.01)

(56)           References Cited

U.S. PATENT DOCUMENTS

| | | | |
|---|---|---|---|
| 9,991,677 B2 | 6/2018 | Briggs et al. | |
| 2002/0064199 A1* | 5/2002 | Takei .................. | H01S 5/04254 |
| | | | 372/46.012 |
| 2002/0141467 A1 | 10/2002 | Iwai et al. | |
| 2007/0248134 A1* | 10/2007 | Hatori .................... | B82Y 20/00 |
| | | | 372/45.01 |
| 2008/0199131 A1 | 8/2008 | Matsuda | |
| 2011/0101250 A1 | 5/2011 | Hu | |
| 2014/0008553 A1 | 1/2014 | Hu | |
| 2015/0333482 A1 | 11/2015 | Briggs et al. | |

OTHER PUBLICATIONS

Wang et al., "1.3 μm Laterally-coupled Distributed Feedback Laser with a Triangular Prism Etched Facet", Proc. SPIE 11023, Fifth Symposium on Novel Optoelectronic Detection Technology and Application, 2019, 4 pages.

Von Edlinger et al., "Widely-Tunable Interband Cascade Lasers for the Mid-Infrared", European Conference on Lasers and Electro-Optics—European Quantum Electronics Conference, Proc. of SPIE vol. 9370, 2015, 7 pages.
Apiratikul et al., "GaInAsSb—AlGaAsSb laterally coupled distributed-feedback metamorphic laser grown on a GaAs substrate at 2 μm", CLEO: 2013, Technical Digest, 2013, 2 pages.
Dridi et al., "Narrow-Linewidth and Single-Mode 1.55 μm Laterally-Coupled Distributed Feedback Laser Fabricated by Standard I-Line Stepper Lithography", ACP Technical Digest, 2012, 3 pages.
Kamp et al., "Lateral coupling—a material independent way to complex coupled DFB lasers", Optical Materials, vol. 17, Issues 1-2, 2001, pp. 19-25.
Yu et al., "High-power, room-temperature, and continuous-wave operation of distributed-feedback quantum-cascade lasers at $\lambda\sim4.8$ μm", Appl. Phys. Lett., 87, 041104, 2005, 1 page (Abstract Only).
Koehler et al., "Single-mode tunable, pulsed, and continuous wave quantum-cascade distributed feedback lasers at $\lambda\cong4.6$-4.7 μm", Appl. Phys. Lett. 76, 1092, 2000, 1 page (Abstract Only).
Hofstetter et al., "High-temperature operation of distributed feed-back quantum-cascade lasers at 5.3 μm", Appl. Phys. Lett. 78, 396, 2001, 3 pages.
Carras et al., "Top grating index-coupled distributed feedback quantum cascade lasers", Appl. Phys. Lett. 93, 011109, 2008, 1 page (Abstract Only).
Coutard et al., "Volume Fabrication of Quantum Cascade Lasers on 200 mm-CMOS pilot line", Scientific Reports 10(1), 6185, 2020, 8 pages.

\* cited by examiner

Section A-A

Section A-A

Section A-A

Section A-A

Section A-A

Section A-A

Section A-A

Section A-A

Section A-A

Section A-A

Section A-A

Section A-A

Section A-A

Section A-A 34
340

Section A-A

Section A-A

LASER COMPRISING A DISTRIBUTED BRAGG MIRROR AND PRODUCTION METHOD

TECHNICAL FIELD

The present invention relates to the field of optoelectronics. It can be implemented to produce light-emitting components, particularly in the mid-infrared (MIR) spectral range. It finds a particularly advantageous application in the production of distributed Bragg mirrors for quantum cascade laser sources in CMOS compatible technology. An example of a particular application is environmental sensors using MIR sources.

PRIOR ART

A laser comprising a distributed Bragg reflector is called a Distributed FeedBack (DFB) laser.

The laser can be based on a quantum cascade amplification principle. In this case, such a laser is called a QCL (Quantum Cascade Laser).

One functional principle of the quantum cascade laser is that the active region of the laser is electrically polarised via electrodes, such that electrons are injected. This active region typically comprises a multiplicity of quantum wells wherein an electron will successively lose part of its energy, in a cascade, while emitting a photon of given energy each time. These photons form the light radiation of wavelength $\lambda$.

This light radiation propagates in a guided manner inside the optical cavity of the laser. This optical cavity is typically bounded by bottom and top layers called LOC (acronym for "Low Optical Confinement"), and at least one Bragg reflector. The LOC layers help to better confine the optical mode in the active region.

The distributed Bragg reflector is a mirror that can reflect light radiation with a given wavelength $\lambda$ with a reflectivity R greater than 99%. Such a mirror typically comprises periodic corrugations with different refractive indices. A partial reflection of the light radiation occurs with each alternating index. For a grating pitch of the order of $\Lambda = m \cdot \lambda / 2n$, where n is the effective refractive index and m is the grating order, the partial reflections combine by constructive interference, and the corrugations "distributed" along the grating act as a high-quality mirror.

Distributed Bragg reflectors or mirrors are therefore particularly advantageous for manufacturing single-mode lasers with a very narrow spectral emission width.

Among the many applications of optical systems comprising DFB QCL lasers, the detection of chemical or biological elements ($CO2$, $CH4$, $NH3$ . . . , glucose . . . ) is particularly interesting. The very narrow spectral width of DFB QCL lasers helps to advantageously increase the detection sensitivity.

The performance of these lasers depends particularly on the quality of the distributed Bragg reflectors and the quality of the electron injection into the active region.

Document US 2015333482 A1 discloses a DFB QCL laser architecture designed to emit monochromatic light radiation along a longitudinal direction x. As schematically illustrated on FIG. 1, the key elements of this architecture comprise a stack 10 along z of layers made of III-V materials, and a Bragg reflector 65 formed by periodic lateral corrugations 6 of period $\Lambda$ on the lateral flanks 101, 102 of the stack 10.

This architecture further includes a top electrode 50 arranged on top of the stack 10 of layers. Such an architecture helps to improve heat dissipation via the top electrode, while maintaining high reflectivity via the lateral DFB structuring.

Documents US 20110101250 A1, "1.3 μm laterally coupled distributed feedback laser with a triangular prism etched facet, Wang Q. C et al., 5th Symposium on novel Optoelectronic Detection Technology and Application, SPIE vol. 11023 (2019)", "Widely tunable interband cascade lasers for the mid-infrared, Von Edlinger et al., quantum sensing and nanophotonic devices XII, SPIE vol. 9370 (2015)" also disclose DFB laser architectures with lateral corrugations.

However, there is a need to further improve the performance of a lateral DFB-structured laser.

It is therefore an object of the present invention to provide a lateral DFB-structured laser with enhanced performance.

It is also an object of the present invention to provide a method of manufacturing such a laser.

The other objects, features and advantages of the present invention will become apparent upon examination of the following description and accompanying drawings. It is understood that other advantages can be incorporated. In particular, certain characteristics and certain advantages of the laser may apply mutatis mutandis to the method, and vice versa.

SUMMARY

In order to achieve this objective, a laser comprising a distributed Bragg mirror is proposed in one embodiment.

The laser is designed to emit light radiation along a longitudinal direction x and comprises a waveguide formed at least in part in a stack of layers made of III-V materials. This waveguide comprises at least one active region of the stack, configured to emit said light radiation.

The mirror comprises lateral corrugations arranged periodically along x in a period $\Lambda$. These lateral corrugations are carried by at least one lateral plane xz defined by the longitudinal direction x and a first transverse direction z that is normal to the longitudinal direction x. These lateral corrugations have a dimension d along a second transverse direction y that is normal to the longitudinal direction x.

The laser further comprises a top electrode arranged on the waveguide, along the first transverse direction z.

Advantageously, the lateral corrugations of the Bragg mirror are located at least partly at the lateral flanks of the top electrode, and only on said lateral flanks, said lateral flanks extending parallel to the lateral plane xz.

In particular, the lateral corrugations do not extend over any lateral flanks of the active region. The active region thus remains intact under the top electrode.

The active region of an QCL laser can be decomposed into separate functional areas: photon emission areas and electron injection areas. Structurally, the quantum well stack in the active region can serve as a Bragg resonator, particularly in the injection areas, for the electron wave functions. This can then generate a low amplitude band gap between the emission areas.

In the development of the present invention, it has been observed that the lateral DFB structuring of the active region according to the prior art generates characteristic lengths $\Lambda/2$ along x in the active region, for each emission area and each injection area. Such a characteristic dimension is smaller than the electron scattering length. This greatly disturbs the injection of electrons, particularly in the vicinity of the lateral DFB structuring. In particular, the corrugations increase the developed surface of the lateral flanks of the active region. The passivation of these lateral flanks is imperfect. The probability of non-radiative recombinations therefore increases, and all the more so as the width of the corrugations is smaller than the electron scattering length. Therefore, these electrons do not contribute to light emission. The injection efficiency is thus reduced. The laser threshold is increased. By construction, it therefore appears that lateral DFB structuring of the active region causes inefficient electron injection.

In order to avoid lateral structuring of the active region of the QCL lasers, the lateral DFB structuring in this instance is performed in the top injection electrode. This helps to improve the injection of electrons into the active region. This also helps to substantially minimise the optical losses of the laser.

Surprisingly, the lateral DFB structuring of the metal top electrode allows for efficient optical feedback. Such lateral DFB structuring of the metal top electrode also helps to achieve proper control of the far field associated with the light radiation emitted by the QCL laser.

The laterally structured Bragg reflector in the top electrode thus helps to achieve the optical performance required for the DFB QCL while ensuring improved electrical injection. The performance of the laser is thus improved.

In another aspect, a method of forming a laser comprising a distributed Bragg mirror is proposed. This method comprises:

Providing a stack of layers made of III-V materials comprising at least one active region for emitting light radiation, Forming a waveguide pattern in the layer stack, said waveguide pattern having a length L along a longitudinal direction x, a height h along a first transverse direction z and a width w along a second transverse direction y, the first and second transverse directions z, y being normal to the longitudinal direction x, A first deposition of a first metal layer on a top of the waveguide pattern, Structuring said first metal layer so as to form a top electrode having lateral flanks that extend parallel to a lateral plane xz defined by the longitudinal direction x and the first transverse direction z.

Advantageously, said structuring is configured to form lateral corrugations at said lateral flanks of the top electrode, and only at said lateral flanks, said lateral corrugations being periodic with period $\Lambda$ along the longitudinal direction x and extending mainly along the first transverse direction z, and having a dimension d along the second transverse direction y, such that said top electrode forms, at least partly, the distributed Bragg mirror.

This method is typically used to produce lasers as described above, with improved performance. This method is also typically based on a silicon technology process that is advantageously compatible with a so-called CMOS production line (production of complementary metal-oxide-semiconductor transistors).

BRIEF DESCRIPTION OF THE FIGURES

The goals, objects, features and advantages of the invention will become more apparent from the detailed description of embodiments of the invention illustrated by the following accompanying drawings wherein.

Figure 1:
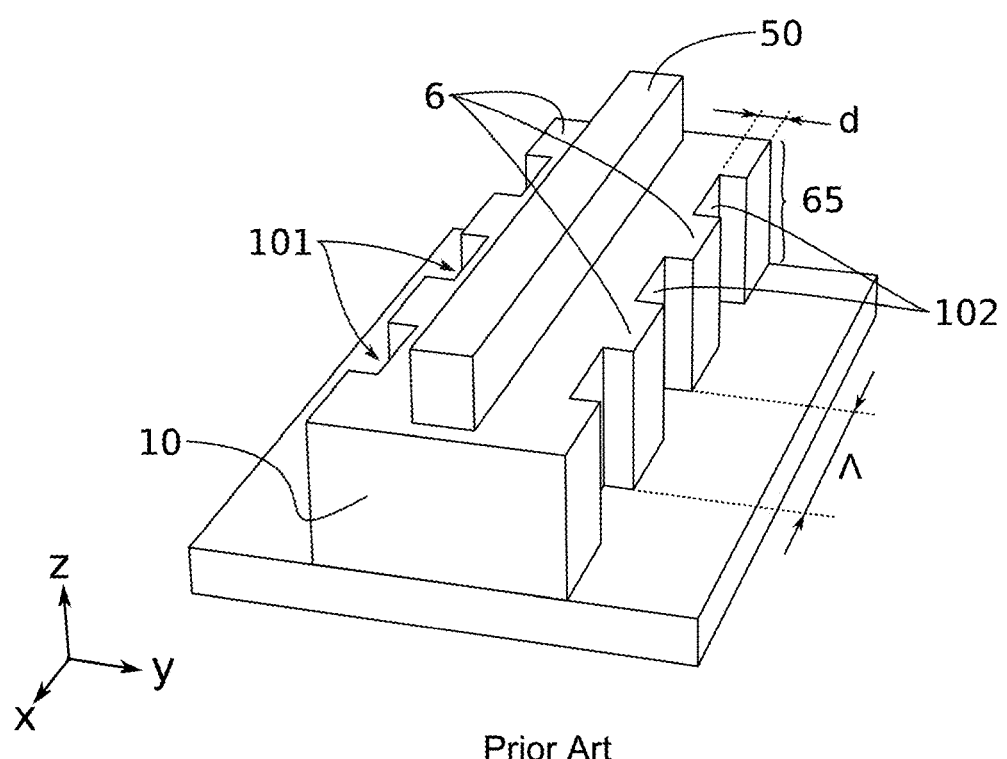
FIG. 1 very schematically illustrates a laterally structured DFB laser comprising a top electrode according to the prior art.

The drawings are given by way of examples and not intended to limit the invention. They constitute schematic representations of principle designed to facilitate understanding of the invention and are not necessarily on the scale of practical applications. In particular, the thicknesses of the various layers, and the dimensions of the corrugations and patterns in the schematic diagrams do not represent the reality.

DETAILED DESCRIPTION

Before proceeding to a detailed review of embodiments of the invention, the following are optional features that may be used in combination or alternatively:

In one example, the lateral corrugations of the Bragg mirror extend only along the lateral flanks of the top electrode. Thus, no layer of the stack of layers made of III-V material is involved in the lateral DFB.

In one example, the waveguide comprises an InGaAs-based top layer with a dopant concentration greater than or equal to $1 \times 10^{19}$ cm$^{-3}$. The lateral corrugations of the Bragg mirror extend from the lateral flanks of the top electrode to the lateral flanks of said top layer. The electrical injection into the active region is advantageously not disturbed when the lateral structuring of the DFB extends to the top layer of the stack.

In one example, the waveguide has a height h less than or equal to 6 μm. This helps to improve the optical reflection efficiency of the lateral Bragg reflector formed at the metal top electrode. This height h value can be optimised depending on the emission wavelength, the guide width and the stack of layers made of III-V materials.

In one example, the lateral corrugations of the Bragg mirror have a dimension in height h' less than or equal to 1 μm.

In one example, the period $\Lambda$ and the dimension d are chosen such that $0.2 \leq d/\Lambda \leq 2$, and preferably $0.4 \leq d/\Lambda \leq 0.8$.

In one example, the laser is a quantum cascade laser.

In one example, the method also comprises a structuring of an InGaAs-based top layer of the waveguide, such that the lateral corrugations of the Bragg mirror extend from the lateral flanks of the top electrode right to lateral flanks of said top layer. This structuring of the InGaAs-based top layer can be assisted by the presence of a barrier layer inside the stack, for example under or inside said top layer. Such a barrier helps to properly control the height $h_{16}$ along which the lateral corrugations extend on the lateral flanks of said InGaAs-based top layer.

In one example, the lateral corrugations of the Bragg mirror extend on the lateral flanks of said top layer, on a height $h_{16}$ greater than or equal to 50 nm.

In one example, the lateral corrugations of the Bragg mirror have a dimension in height $h_{16}$ at the lateral flanks of said top layer, the dimension in height $h_{16}$ being greater than or equal to 50 nm.

In one example, the structuring of the InGaAs-based top layer is performed before the structuring of the first metal layer and the structuring of the first metal layer is aligned with the structuring of the InGaAs-based top layer.

In one example, the structuring of the InGaAs-based top layer is performed before the structuring of the first metal layer and the structuring of the first metal layer is used as a mask for the structuring of the InGaAs-based top layer. This helps to achieve a proper alignment of the lateral corrugations along the flanks of the top electrode and the top layer.

In one example, after the structuring the first metal layer, the method also comprises a second deposition of a second metal layer on the top electrode. This helps to increase the thickness of the top electrode, while gaining a good resolution for defining the lateral corrugations of the DFB. A sufficiently thick top electrode helps to lower electrical access resistance and dissipate heat during operation.

In one example, the second deposition is performed by electrochemical deposition.

In one example, the method also comprises a complementary structuring of the second metal layer, so as to form a complementary electrode pattern on the top electrode.

In one example, said complementary structuring is configured so as to extend the lateral corrugations of the top electrode on the lateral flanks of the complementary electrode pattern.

In one example, said complementary structuring is configured such that the complementary electrode pattern has lateral flanks parallel to the lateral plane xz and free of any lateral corrugations.

Barring any incompatibility, it is understood that the mirror, the manufacturing method, and the laser may comprise, mutatis mutandis, all of the optional characteristics hereinabove.

In the present invention, the terms "Bragg mirror", "Bragg grating" or "distributed Bragg reflector" or even "DFB (Distributed FeedBack)" are used synonymously. The Bragg mirror is configured in this instance to be used as a reflector for a waveguide. It comprises a periodic alternation of materials with different refractive indices. This alternation induces a periodic variation of the effective refractive index in the waveguide. Such an alternation is reproduced at least twice in a Bragg mirror according to the present invention.

This alternation is typically produced by lateral corrugations. Lateral corrugations refer to elements projecting from a lateral plane. They may have different profiles projecting along an xy plane, for example and not restrictively: a crenelated profile as illustrated in the accompanying drawings, or a sinusoidal or triangular profile.

It is specified that, in the present invention, the terms "on", "overlying", "overlapping", "underlying", "with" and their equivalents do not necessarily mean "in contact with". For example, the deposition of a first layer on a second layer does not necessarily mean that the two layers are directly in contact with each other, but rather means that the first layer at least partially overlaps the second layer by being either directly in contact or separated from it by at least one other layer or at least one other element.

Additionally, a layer may be composed of multiple sublayers of the same material or different materials.

A substrate, a stack, a layer, "based on" a material A or "A-based", means a substrate, a stack, a layer comprising the material A only or the material A and optionally other materials, such as alloying elements and/or doping elements.

The doping ranges associated with the different types of doping indicated in the present application are the following:

doping p++ or n++: greater than $1 \times 10^{20}$ cm-3 doping p+ or n+: $1 \times 10^{18}$ cm-3 to $9 \times 10^{19}$ cm-3 doping p or n: $1 \times 10^{17}$ cm-3 to $1 \times 10^{18}$ cm-3

Intrinsic doping: $1 \times 10^{15}$ cm-3 to $1 \times 10^{17}$ cm-3

The examples of embodiments described hereinafter indicate n-type doping. Other embodiments wherein p-type doping is performed can also be considered. Accordingly, QCL lasers wherein the charge carriers are holes can also be produced according to the present invention.

The mid-infrared (MIR) range typically comprises wavelengths $\lambda$ of between 3 μm and 12 μm. An example of implementation of the method is provided for making a DFB QCL laser emitting at a wavelength of 7.4 μm. The Bragg mirror typically has a reflectivity peak centred on the wavelength $\lambda$.

Several embodiments of the invention implementing successive steps of the fabrication method are described below. Unless explicitly stated, the adjective "successive", even if it is generally preferred, does not necessarily imply that the steps immediately follow each other, since they can be separated by intermediate steps.

Furthermore, the term "step" implies the performance of a part of the method, and can designate a set of sub-steps.

Furthermore, the term "step" does not necessarily mean that the actions carried out during a step are simultaneous or immediately successive. In particular, some actions of a first step may be followed by actions related to a different step, and other actions of the first step may be repeated afterwards. Accordingly, the term step does not necessarily mean unitary and inseparable actions in time and in the sequence of the method's phases.

A preferably orthonormal reference marker comprising the x, y, z axes is shown on the figures annexed hereto. When only one reference mark is shown on a single sheet of figures, this reference marker applies to all the figures on this sheet.

In the present patent application, the thickness of a layer is taken in a direction normal to the main plane of extension of the layer. Accordingly, a layer typically has a thickness along z. The relative terms "on", "overlying", "under", "underlying" refer to positions taken in the direction z.

The terms "vertical", "vertically" refer to a direction along z. The terms "horizontal", "horizontally" refer to a direction along the xy plane. The term "lateral" refers to an xz plane. Accordingly, lateral corrugations are carried by an xz plane. Lateral structuring is carried out at an xz plane.

An element located "flush with" or "in line with" another element means that these two elements are both located on the same line perpendicular to a plane in which a bottom or top face of a substrate mainly extends, i.e. on the same line running vertically on the figures.

Figure 2A:
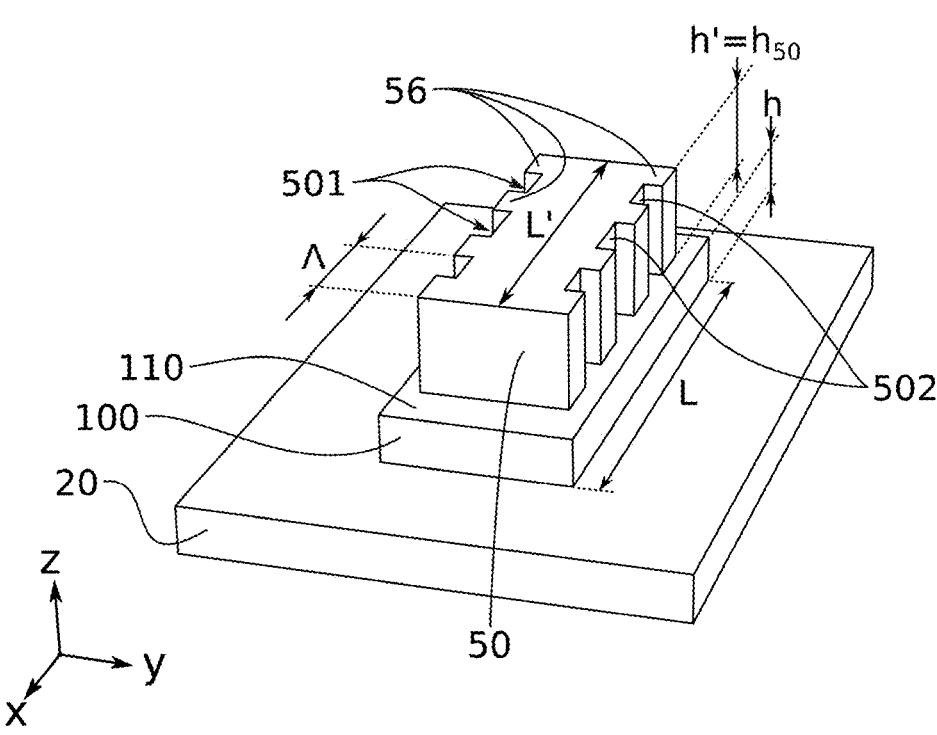
FIG. 2A schematically illustrates a laterally structured DFB laser according to a first embodiment of the present invention.

A first example of a laser according to the invention is shown on FIG. 2A. In this example, a waveguide 100 made of III-V materials is formed on a substrate 20. This waveguide 100 comprises at least one active region designed to emit a light radiation with a wavelength $\lambda$. It is overlaid by a top electrode 50 with a lateral DFB structure. The assembly thus forms a DFB QCL laser.

The waveguide 100 typically has a length L along x, a width w along y and a height h along z. The length L is typically of the order of a few hundred microns to a few millimetres, for example between 500 μm and 4 mm, or even 6 mm. For example, L=1 mm or L=2 mm is preferably chosen. The width w is of the order of a few microns, for example between 4 μm and 10 μm, for example w=8 μm. The height h is typically of the order of a few microns, for example between 1 μm and 5 μm, for example w=3.2 μm. Preferably, the height h is less than 4 μm. This helps to maintain a properly efficient lateral DFB of the top electrode 50 for optical reflection. Indeed, for waveguide heights h greater than approximately 4 μm, the optical mode of a radiation with a wavelength λ=7.4 μm is highly confined in the waveguide. This reduces the efficiency of the metal DFB. Therefore, the total length L' of the lateral metal DFB must be increased to achieve sufficient optical reflection for the QCL laser, as illustrated on FIG. 4 and detailed subsequently. In contrast, for waveguide heights h less than approximately 4 μm, the optical mode has good coupling with the DFB grating.

The waveguide 100 may be a ribbon waveguide with a rectangular cross-section, or a ridge waveguide with an inverted T-section. In the case of a ridge waveguide, the top portion of the waveguide is typically in the form of a longitudinally extending mesa of length L, width $w_m$<w and height $h_m$<h. The top of the waveguide in this instance is the top of the mesa. Other waveguide geometries are also possible.

The waveguide 100 may be formed from a vignette comprising a stack 10 of layers made of III-V materials, transferred onto a silicon-based substrate. This transfer may typically be by molecular bonding. The vignette may be in the form of a two-inch InP substrate on which the stack 10 is formed. Thus, the substrate 20 typically comprises a silicon portion and optionally an InP portion and/or some layers of the stack 10. The InP substrate may be thinned or removed partially or completely during transfer, before or after bonding. The waveguide 100 is structured in the top layers of the stack 10.

The stack 10 typically comprises a plurality of layers designed for electron injection, light radiation emission and light radiation guidance.

In one embodiment, the stack 10 may comprise, from the bonding interface to the top surface 110 of the stack along z:

A layer made of n+ or n++ doped InP, with a thickness between 1.5 μm and 5 μm, or even 6 μm, An n++ InGaAs layer of 100 nm to 300 nm can advantageously be interposed within the above-mentioned n+ or n++ InP layer. This n++ InGaAs layer is preferably located at a depth of between 1 μm and 3 μm, ideally between 1.5 μm and 2 μm, from the top surface of the n+ or n++ InP layer. This doped InGaAs layer typically has a doping level at least a factor of 10 higher than the doping level of the above-mentioned n+ or n++ InP layer.

an InGaAs-based layer, called LOC, with a thickness of between 20 nm and 200 nm, an active region with a thickness of between 1.5 μm and 4 μm, an InGaAs-based layer, called LOC, with a thickness of between 20 nm and 200 nm, an InP-based layer with a thickness of between 200 nm and 3 μm, and a low doping level, A layer made of on n+ or n++ doped InGaAs, with a thickness between 20 nm and 300 nm. This doped InGaAs layer typically has a doping level at least a factor of 10 higher than the doping level of the underlying InP layer.

The n+ or n++ doped layers typically participate in injecting electrons into the active region. LOC layers typically help to confine light radiation in the active region. They typically have a low refractive index, for example of the order of 3.18 for a wavelength λ of the order of 7.4 μm, and are called guiding layers. The low doping level of the InP layer helps to minimise optical losses. The relatively large thickness of this InP layer helps to homogeneously distribute the electron injection throughout the active region.

The active region typically comprises a multiplicity of quantum wells wherein an electron will transit in a cascade, while emitting light radiation. In one embodiment, the active region may comprise alternating InGaAs and AlInAs layers. The reader may refer to the document "Carras, M. et al. Top grating index-coupled distributed feedback quantum cascade lasers. Appl. Phys. Lett. 93, 011109 (2008)" on how to design the active region, particularly on how to choose InGaAs/AlInAs heterostructures, the number of periods and/or quantum wells, the resonant superlattice architecture.

The top electrode 50 overlies the top of the waveguide 100. It is made of metal material. for example, it is composed of one or more layers made of gold, and/or titanium, and/or titanium nitride, and/or aluminium-copper alloy, and/or tungsten. It has a height $h_{50}$ along z, preferably of between 1 μm and 3 μm. It also has lateral flanks 501, 502 parallel to the xz plane. Advantageously, this electrode is structured at its lateral flanks 501, 502 so as to form a distributed Bragg or lateral DFB reflector. Thus, it typically has corrugations 56 on the lateral flanks 501, 502. These corrugations 56 are regularly distributed in x in a period Λ. The period Λ is preferably chosen such that Λ=m·λ/2n, λ being the wavelength of the light radiation, n being the effective refractive index of the optical mode of propagation of the light radiation, and m the grating order of the Bragg reflector. The top electrode 50 and/or the stack 10 may be encapsulated by an encapsulating layer, typically made of a dielectric material.

The corrugations 56 are arranged on either side of the flanks 501, 502, facing each other along y. They each have a dimension d along y and a dimension I along x. In this example, the corrugations 56 have a height h'=$h_{50}$, such that they extend over the entire height of the electrode 50. The dimension d is of the order of a few microns, for example 1.5 μm. For example, the dimension I is equal to half a period Λ/2. The overall width of the electrode 50, including the corrugations 56 is preferably equal to the width of the top of the waveguide 100, w or $w_m$. Accordingly, the electrode 50 may have alternating narrow portions of width 5 μm and wide portions, at the corrugations 56, of width 8 μm for example. The width modulation along y is chosen such that d/Λ<1. In one example, the period Λ and the dimension d are chosen such that 0.2≤d/Λ≤2, and preferably such that 0.4≤d/Λ≤0.8, for example d/Λ=0.625. This helps to achieve a good compromise between the coupling strength of the Bragg grating and the efficiency of the QCL laser. All the lateral corrugations form the lateral DFB of length L' and height h'.

The sizing of the laser can be performed as follows:

The effective band-gap of the active region of the QCL laser can be measured by photoluminescence, in order to accurately determine the emission wavelength λ of the active region.

The effective index of the fundamental optical mode of the laser can be assessed experimentally by separately making Fabry Perot cavities from the stack of layers designed to form the QCL laser. Alternatively, it can be modelled from the material properties of the layers in the stack.

The period $\Lambda$ of the DFB grating can then be calculated for the wavelength $\lambda$.

The optical mode confinement at the active region of the QCL can be assessed numerically, for example using Nextnano® software. For a wavelength $\lambda$=7.4 μm, a power overlap of the order of 0.70 is typically chosen. Accordingly, for an InP thickness of 1.2 μm above the active region, the overlap is preferably equal to approximately 0.68 for a waveguide width w of 6 μm, and about 0.70 for a waveguide width w of 8 μm. This allows the optical mode to "see" the edges of the waveguide, and thus to couple with the lateral DFB of the top electrode. For overlap values greater than 0.71, which correspond for example to waveguide widths greater than 10 μm, lateral structuring becomes less effective, and the laser length must be increased. These values can be adjusted according to the nature and thicknesses of the layers in the stack.

The lateral shrinkage dimension d for each corrugation, and the height of the corrugations can then be set so as to achieve a DFB reflectivity greater than or equal to 95%. In general, the coupling strength to the Bragg grating increases as the dimension d of the corrugations increases, up to a maximum limit beyond which the coupling strength remains approximately constant. Reflectivity is typically calculated from the laser threshold, and does not include any optical losses below the laser threshold. Lowering optical losses lowers the laser threshold.

Figure 2B:
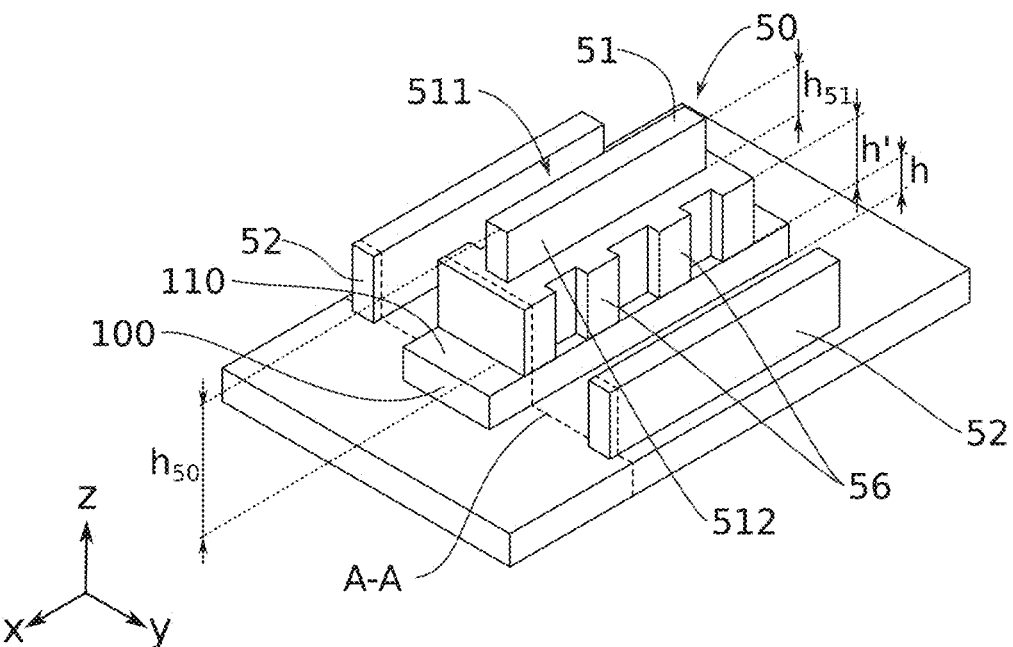
FIG. 2B schematically illustrates a laterally structured DFB laser according to a second embodiment of the present invention.

Another embodiment of the top electrode 50 and the DFB is shown on FIG. 2B. In this embodiment, the lateral corrugations 56 of the electrode 50 do not extend on the entire height $h_{50}$ of the electrode 50, such that $h'<h_{50}$. The top portion 51 of the electrode 50 has substantially planar lateral flanks 511, 512 that are parallel to the xz plane. This top portion 51 may have a height $h_{51}$ of the order of 1 μm to 2 μm for example. This helps to increase the total height $h_{50}$ of the electrode 50. This makes the electrode 50 more robust for electrical contact with electrical connections. This also improves heat dissipation through the electrode 50. This also reduces electrical contact resistance at the electrode 50. In this embodiment, a corrugation height $h'=h_{50}-h_{51}$ greater than or equal to 1 μm, and/or an aspect ratio $h_{50}/h_{51} \geq 1$ will typically be chosen. For example, for an electrode with a height $h_{50}$=2 μm, the aspect ratio $h_{50}/h_{51}$ is preferably greater than or equal to 1. For an electrode with a height $h_{50}$=3 μm, the aspect ratio $h_{50}/h_{51}$ is preferably greater than or equal to 2. The reflectivity of the DFB can be substantially the same as in the case of corrugations extending on the entire height $h_{50}$ of the electrode, insofar as the optical mode does not "see" the top portion 51 of the electrode 50. The overall width of the electrode 50, including the lateral corrugations 56 may be substantially equal to the width of the waveguide 100. Thus, the lateral corrugations 56 have side surfaces that are flush with the lateral flanks 101, 102 of the waveguide 100.

Figure 2C:
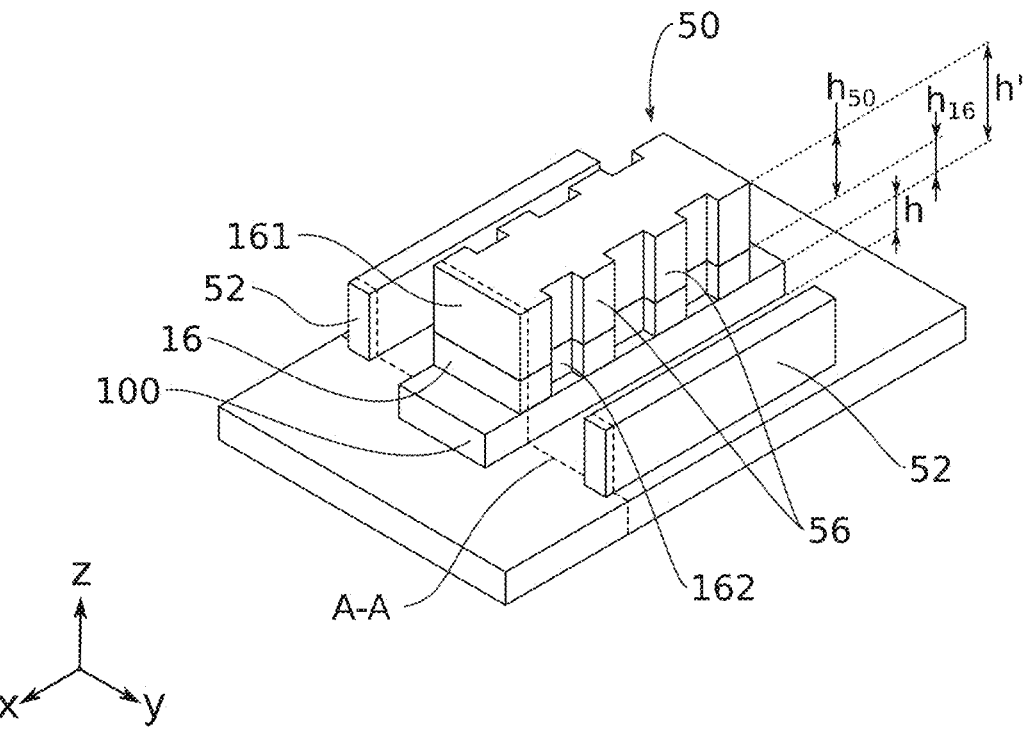
FIG. 2C schematically illustrates a laterally structured DFB laser according to a third embodiment of the present invention.

Another embodiment of the top electrode 50 and the DFB is illustrated on FIG. 2C. In this embodiment, the lateral corrugations 56 of the DFB extend along a height $h'>h_{50}$. Thus, the lateral corrugations extend from the lateral flanks 501, 502 of the electrode 50 to the lateral flanks 161, 162 of the top layer 16 of the stack 10. This top layer 16 is typically a layer made of n+ or n++ doped InGaAs, with a thickness between 20 nm and 100 nm. In this embodiment, the lateral corrugations 56 of the DFB are partly made the electrode 50 and in the top layer 16 of the stack. This helps to brings the DFB closer to the active region, without significantly disturbing electron injection. The height $h_{16}$ of the portion of corrugations made in the layer 16 may be less than or equal to the thickness of the layer 16. The portions of the corrugations 56 made in the layer 16 are substantially flush with the portions of the corrugations made in the electrode 50. The total height of the corrugations 56 in this instance is $h'=h_{50}+h_{16}$. This embodiment may be combined with the previous one such that the electrode 50 comprises a top portion 51 free of any corrugations. In one embodiment, the corrugations 56 extend from the lateral flanks 501, 502 of the electrode 50 to the lateral flanks of the layer 15 of the stack 10. In all cases, the corrugations 56 do not extend at the lateral flanks of the active region 13.

These embodiments of lateral DFBs at least partly at the electrode 50 have the advantage of minimising optical losses on the flanks of the waveguide 100, and preventing a disturbance of electron injection into the active region.

Figure 3:
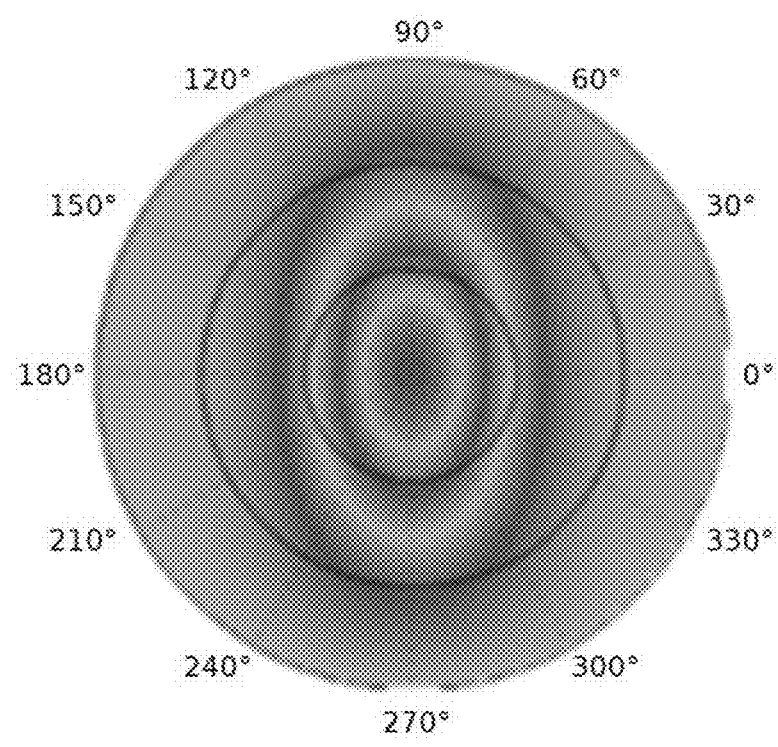
FIG. 3 illustrates the far field distribution of the intensity emitted by a DFB laser according to an embodiment of the present invention.

This type of lateral DFBs also helps to prevent far-field disturbance of the light radiation emitted by the active region. As illustrated on FIG. 3, the far-field distribution of the light radiation intensity is not significantly altered by the presence of the lateral DFB above the waveguide. This helps to properly control the far-field light radiation. In particular, the fact that the lateral corrugations do not extend to the active region reduces the divergence of the beam formed by the light radiation. The divergence decreases as the height $h_{16}$ decreases or even drops to zero. The fact that the electrode 50 participates in the DFB grating advantageously reduces the height of the lateral corrugations in the III-V layer stack. The beam is therefore less divergent in such a guide, all other things being equal, than in a guide according to the prior art.

Figure 4:
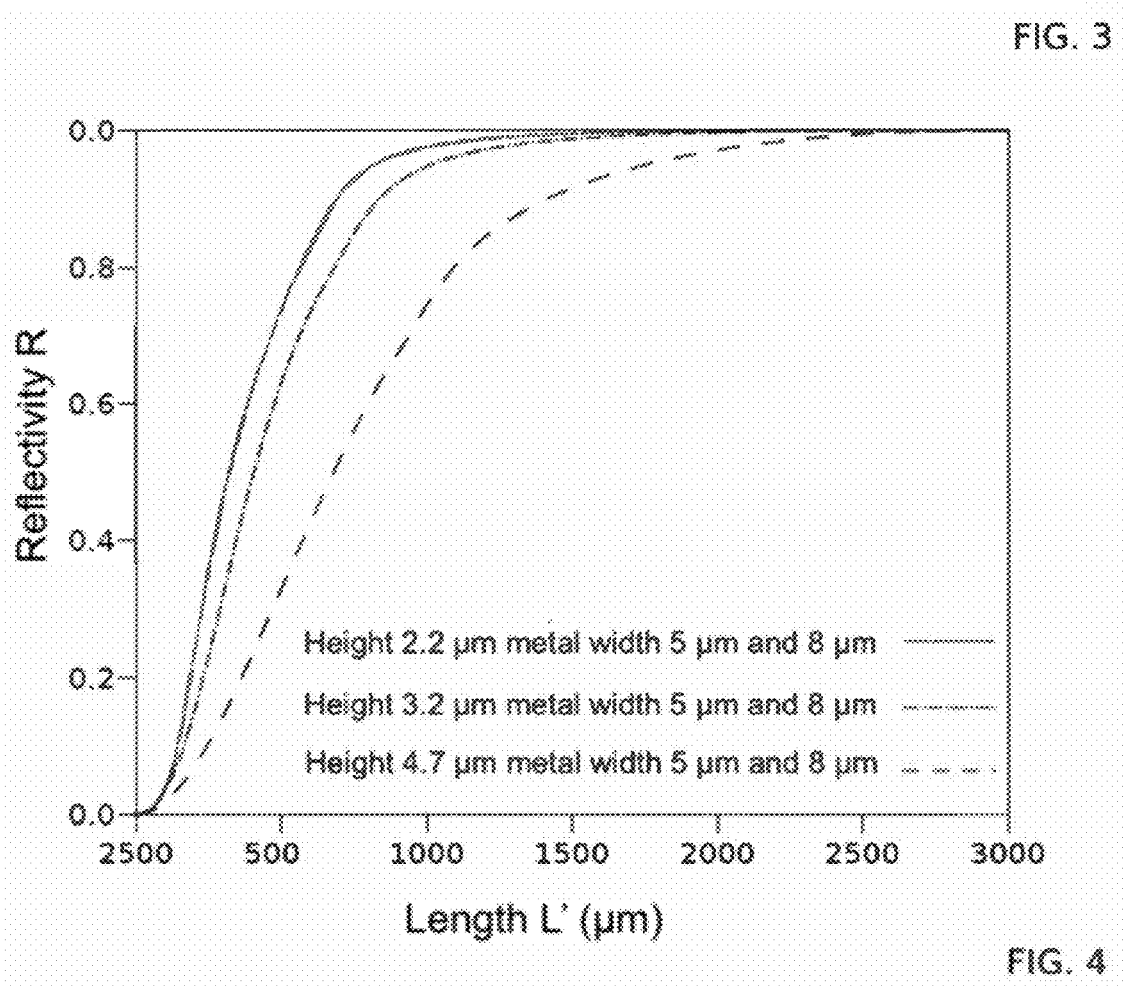
FIG. 4 illustrates the reflectivity of a laterally structured distributed Bragg reflector for different stack heights according to an embodiment of the present invention.

FIG. 4 illustrates a calculation of reflectivity R for metal lateral DFBs with a width modulation between 5 μm and 8 μm in alternation, depending on their length L'. The reflectivity curves R(L') are plotted for different heights h of waveguides 100.

The ratio $d/\Lambda$ in this instance is equal to 0.625. The waveguide width is 8 μm. In order to obtain a reflectivity greater than or equal to 95%, it appears that the required DFB length L' decreases when the height h of the guide decreases. Accordingly, a waveguide height h of less than 4 μm is preferably chosen. This helps to design metal lateral DFBs with a reasonable length L', typically less than 1.5 mm. Such DFB dimensions are fully compatible with the abovementioned QCL lasers.

The QCL laser according to the present invention, comprising a metal lateral DFB formed at least partly in the top electrode, without lateral corrugations at the flanks of the active region, can therefore advantageously be integrated into an environmental sensor operating in the mid-infrared range.

Figure 5A:
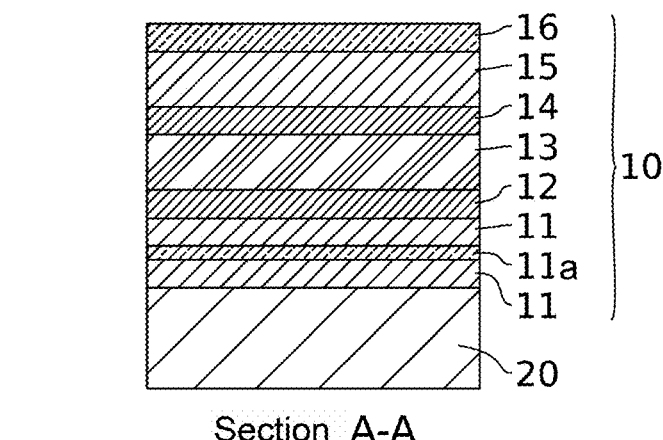
FIGS. 5A to 5P schematically illustrate, in cross-section, steps of a method for making a laterally structured DFB laser according to an embodiment of the present invention.
Figure 5B:
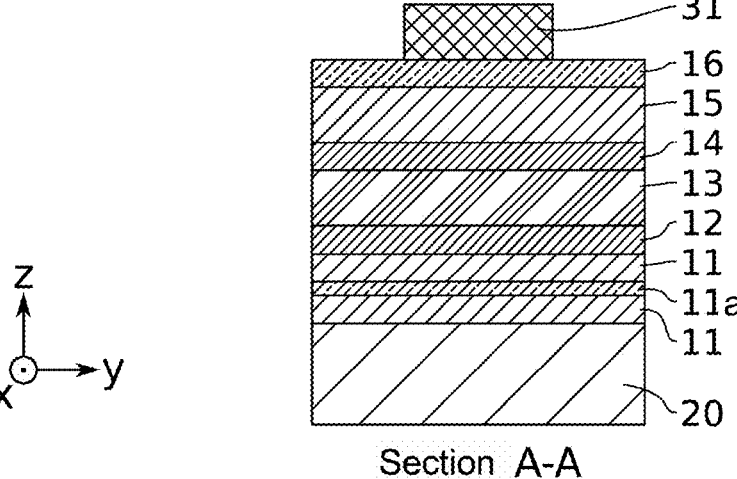
Figure 5C:
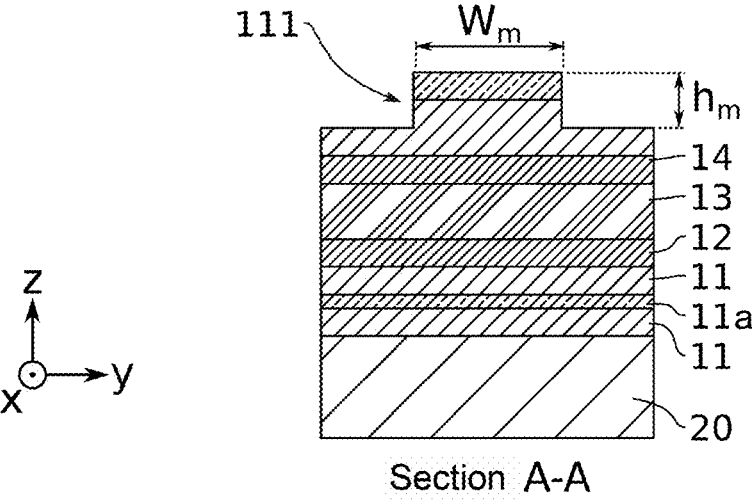
Figures 5D, 5E, 5F:
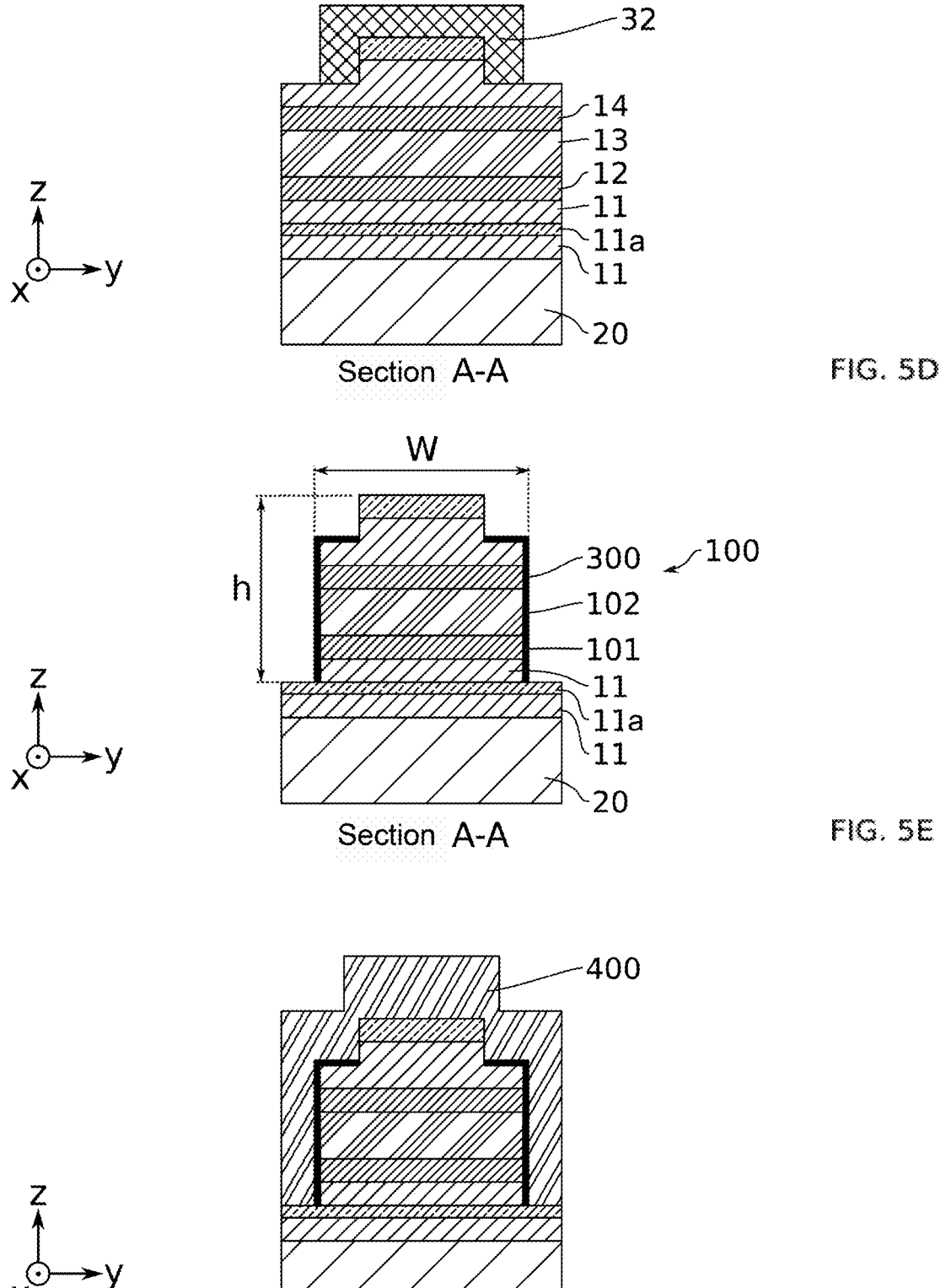
Figure 5G:
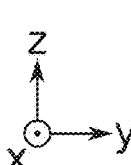
Figure 5G:
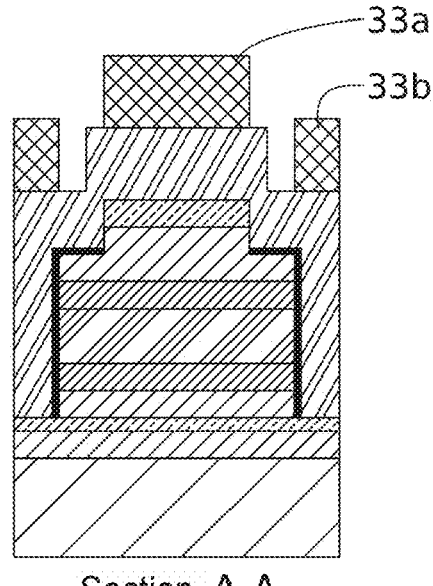
Figure 5H:
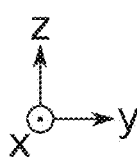
Figure 5H:
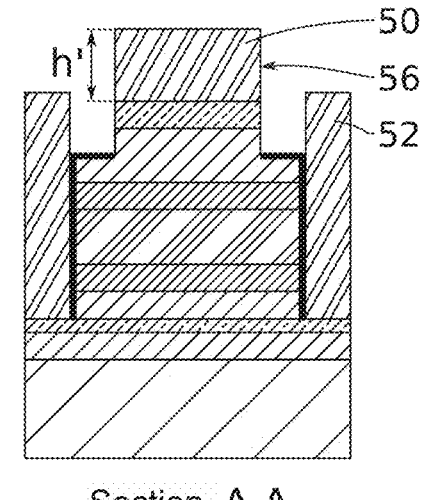
Figure 5I:
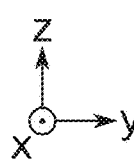
Figure 5I:
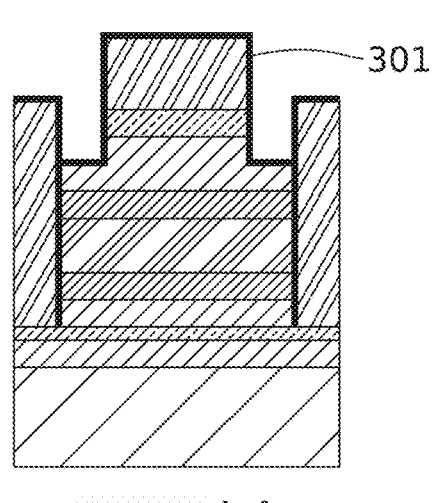
Figure 5J:
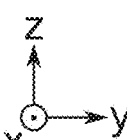
Figure 5J:
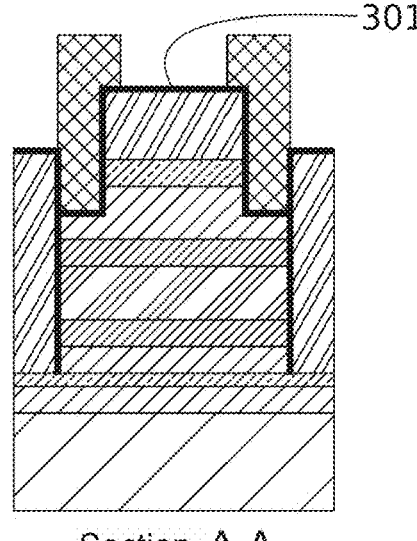
Figure 5K:
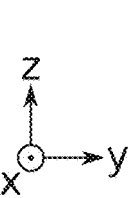
Figure 5K:
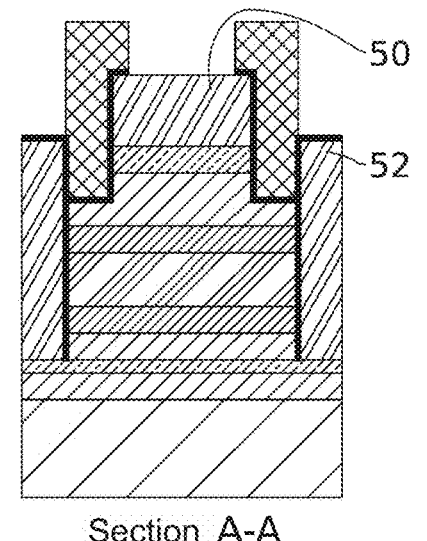
Figure 5L:
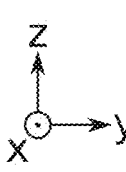
Figure 5L:
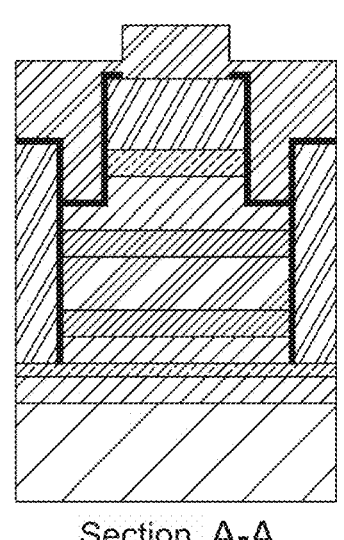
Figure 5M:
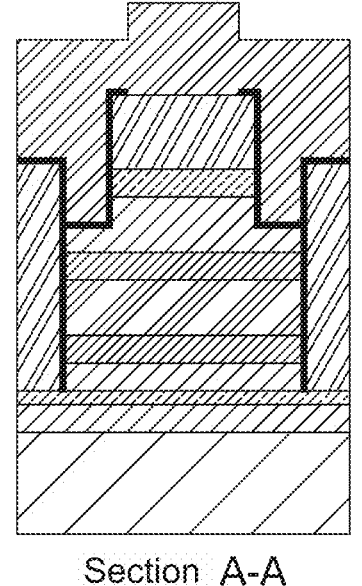
Figure 5N:
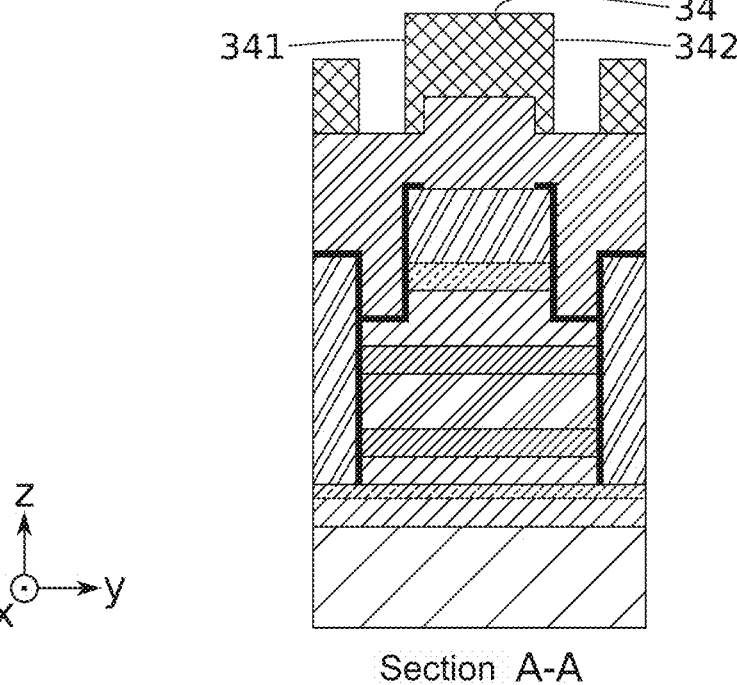
Figure 5O:
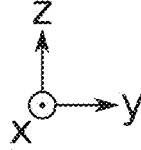
Figure 5O:
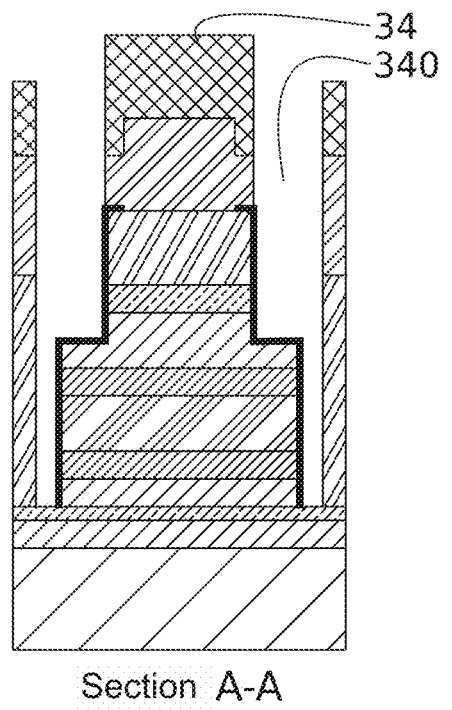
Figure 5P:
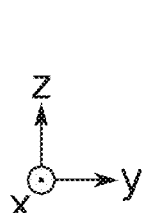
Figure 5P:
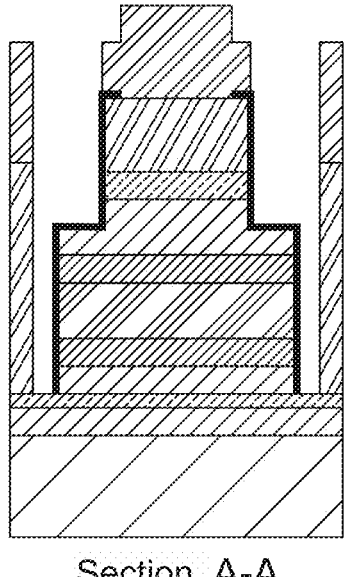

FIGS. 5A to 5P illustrate an embodiment of a method for making such a laser.

A stack 10 of layers 11, 12, 13, 14, 15, 16 carried by a substrate 20 is first provided (FIG. 5A). As previously described, the substrate 20 may be made of silicon. The stack 10 comprises layers made of III-V materials, including:

a layer 11 made of n+ or n++ doped InP, with a thickness between 1.5 μm and 5 μm, a layer made of on n+ or n++ doped InGaAs, with a thickness between 100 nm and 300 nm may be advantageously interposed within the layer 11. This helps to improve electrical injection. This layer 11a can be used to contact the bottom electrode.

an InGaAs-based layer 12, called LOC, with a thickness of between 20 nm and 200 nm, an active region 13 comprising quantum wells and with a thickness of between 1.5 μm and 4 μm, an InGaAs-based layer 14, called LOC, with a thickness of between 20 nm and 200 nm, an InP-based layer 15 with a thickness between 1 μm and 3 μm, a layer 16 made of on n+ or n++ doped InGaAs, with a thickness between 20 nm and 100 nm.

In this example of embodiment, the waveguide formed is a ridge waveguide comprising a mesa top structure. Accordingly, as illustrated on FIGS. 5B, 5C, a solely optional first lithography/etching can be performed so as to form this mesa top structure. FIG. 5B illustrates the formation of a photoresist lithography mask 31 used to define the mesa structure with a width $w_m$. FIG. 5C illustrates the etching of layers 16 and 15 to a depth $h_m$, stopping in layer 15 of InP. The resin mask 31 is then removed and the mesa structure 111 with a width $w_m$ and a height $h_m$ is formed (FIG. 5C).

FIGS. 5D, 5E illustrate the formation of a laser pattern in the stack 10 by lithography/etching. FIG. 5D illustrates the formation of a photoresist lithography mask 32, optionally on the mesa structure 111, that helps to define the laser pattern with width w in the form of a waveguide 100, optionally as a ridge. FIG. 5E illustrates the etching of layers 15, 14, 31, 12, 11 and 11a to a depth—$h_m$, with a ridge in layer 11 of doped InGaAs. Such etching is known and can be performed by anisotropic dry etching along z, for example by ICP (Inductively Coupled Plasma). The InGaAs layer 11a can be used for end-of-etch detection, also called end-point detection (EPD).

After removal of the mask 32, a thin passivation layer 300, typically made of SiN with a thickness of about 300 nm, is deposited on the flanks 101, 102 of the waveguide 100 (FIG. 5E). This passivation layer 300 is opened by lithography/etching at the doped InP layer 11, so as to allow the formation of the lower electrode, and at the mesa structure, so as to allow the formation of the top electrode.

FIG. 5F illustrates the deposition of a metal layer 400 to form the bottom and top electrodes. This metal layer 400 may comprise different sub-layers, for example Ti/TiN adhesion layers and a thick layer of gold or AlCu alloy and/or tungsten. This metal layer 400 preferably has a thickness of approximately 1 μm.

FIG. 5G illustrates the formation and structuring by lithography of a resin-based mask 33a, 33b. This mask 33a, 33b is designed to define the bottom and top electrodes. The mask 33a is structured laterally, typically by deep UV lithography, to define a pattern of lateral corrugations above the metal layer 400.

FIG. 5H illustrates the etching of the exposed areas of the metal layer 400, so as to form the top 50 and bottom 52 electrodes. During etching, the pattern of lateral corrugations is transferred into the top electrode 50 so as to form the DFB. This etch is anisotropic along z. It is configured to stop on the exposed layers of the stack 10. Accordingly, the etching of the top electrode's 50 lateral corrugations 56 is stopped on the layer 16. Etching of the metal layer 400 between the masks 33a, 33b is typically stopped on the SiN layer 300. At this stage, the lateral corrugations 56 with height h' extend along the entire height of the top electrode

50. The device illustrated in FIG. 2A, comprising a purely metal lateral DFB, is thus produced.

In one alternative embodiment, this metal lateral DFB is used as a mask for etching a part of the top layers of the stack 10, for example the top layer 16. Formation of corrugations 56 is thus continued in the top layer 16. The InP layer 15 can be used for end-of-etch detection or EPD. The III-V material part of the corrugations 56 is thus "self-aligned" with the metal part of the corrugations 56. This alternative helps to form the device illustrated on FIG. 2C, comprising a mixed metal and InGaAs lateral DFB.

The method can be continued to thicken the electrodes by successive metal refilling or deposition.

FIG. 5I illustrates a preliminary step of depositing a conformal SiN layer 301, for example by LPCVD (Low Pressure Chemical Vapor Deposition). This 301 layer helps to passivate and electrically insulate the exposed portions of the stack layers.

FIGS. 5J and 5K illustrate the opening of the 301 layer at the top 50 and bottom 52 electrodes, typically by lithography/etching.

A first metal deposition can then be made (FIG. 5L). This first metal deposition may be followed by a second metal deposition, for example by electrochemical deposition (FIG. 5M). This helps to increase the total height of the metal electrodes.

FIG. 5N illustrates the formation of a lithography mask 34 designed to define the "thickened" top and bottom electrodes. This mask 34 for thick metal etching may typically be made of a 5 μm thick TDUR type resin.

In one embodiment, the mask 34 may have flanks 341, 342 featuring corrugations aligned with the existing corrugations of the electrode 50. This helps to increase both the thickness of the top electrode 50 and the height h' of the corrugations 56, so that the lateral corrugations 56 extend along the entire height of the top electrode 50, as in the case illustrated on FIG. 2A.

In another embodiment, the mask 34 may have flanks 341, 342 that are substantially planar and free of any corrugations. This alternative method helps to forms the device illustrated on FIG. 2B, comprising a metal lateral DFB only on a lower portion of the top electrode 50.

The metal at the openings 340 in the mask 34 is then etched down to the passivation layer 301 along the lateral flanks 101, 102 of the stack 10 (FIG. 5O). The bottom electrodes 52 on either side of the stack 10 are thus produced. The mask 34 is then removed (FIG. 5P).

Advantageously, the method helps to produce the laser previously described and illustrated.

The invention is not limited to the previously described embodiments and extends to all embodiments covered by the claims.

In particular, the DFB QCL lasers produced by this method may have other architectures, for example according to a so-called double trench configuration, or according to a configuration allowing two lasers to be contacted with a common electrode.

The invention claimed is:

1. A laser, comprising:

a distributed Bragg mirror;

a waveguide, the laser being configured to emit light radiation along a longitudinal direction x, and the waveguide being formed at least in part in a stack of layers made of III-V materials comprising at least one active region configured to emit the light radiation, wherein the distributed Bragg mirror comprises lateral corrugations distributed periodically along the longitudinal direction x in a period Λ, the lateral corrugations being carried by at least a lateral plane xz defined by the longitudinal direction x and a first transverse direction z normal to the longitudinal direction x, the lateral corrugations having a dimension d along a second transverse direction y normal to the longitudinal direction x; and a top electrode arranged on the waveguide along the first transverse direction z, wherein the lateral corrugations of the Bragg mirror are partly located at lateral flanks of the top electrode, the lateral flanks extending parallel to the lateral plane xz, and the waveguide does not have lateral corrugations.

2. The laser according to claim 1, wherein the waveguide comprises an InGaAs-based top layer with a dopant concentration greater than or equal to $1 \times 10^{19}$ cm$^{-3}$.

3. The laser according to claim 1, wherein the waveguide has a height h less than or equal to 6 µm.

4. The laser according to claim 1, wherein the period Λ and the dimension d are chosen such that $0.2 \leq d/\Lambda \leq 2$.

5. A method for forming a laser comprising a distributed Bragg mirror, comprising:

providing a stack of layers made of III-V materials comprising at least one active region configured to emit light radiation;

forming a waveguide pattern in the stack of layers, the waveguide pattern having a length L along a longitudinal direction x, a height h along a first transverse direction z, and a width w along a second transverse direction y, the first and the second transverse directions being normal to the longitudinal direction x;

depositing a first deposition of a first metal layer on a top of the waveguide pattern; and structuring the first metal layer so as to form a top electrode having lateral flanks that extend parallel to a lateral plane xz defined by the longitudinal direction x and the first transverse direction z, the structuring being configured to form lateral corrugations at the lateral flanks of the top electrode, the lateral corrugations being periodic with period Λ along the longitudinal direction x and having a dimension d along the second transverse direction y, such that the top electrode at least partly forms the distributed Bragg mirror, and the waveguide pattern does not have lateral corrugations.

6. The method according to claim 5, wherein the structuring of the first metal layer is performed by anisotropic etching along the first transverse direction z, the anisotropic etching being configured to stop on the top of the waveguide pattern, so that the lateral corrugations of the distributed Bragg mirror extend along a whole height of the top electrode.

7. The method according to claim 5, further comprising, after the structuring of the first metal layer, depositing a second deposition of a second metal layer on the top electrode.

8. The method according to claim 7, wherein the depositing of the second deposition is performed by electrochemical deposition.

9. The method according to claim 8, further comprising a complementary structuring of the second metal layer, so as to form a complementary electrode pattern on the top electrode.

10. The method according to claim 9, wherein the complementary structuring is configured so as to extend the lateral corrugations of the top electrode on lateral flanks of the complementary electrode pattern.

11. The method according to claim 9, wherein the complementary structuring is configured such that the complementary electrode pattern has lateral flanks parallel to the lateral plane xz and free of any lateral corrugations.

* * * * *